United States Patent
Nakagawa et al.

(10) Patent No.: US 6,172,622 B1
(45) Date of Patent: Jan. 9, 2001

(54) DEMODULATING DEVICE, DEMODULATING METHOD AND SUPPLY MEDIUM

(75) Inventors: Toshiyuki Nakagawa; Yoshihide Shimpuku, both of Kanagawa (JP)

(73) Assignee: Sony Corporation, Tokyo (JP)

( * ) Notice: Under 35 U.S.C. 154(b), the term of this patent shall be extended for 0 days.

(21) Appl. No.: 09/207,827

(22) Filed: Dec. 9, 1998

(30) Foreign Application Priority Data

Dec. 12, 1997 (JP) .................................................. 9-342495

(51) Int. Cl.[7] .................................................... H03M 7/00
(52) U.S. Cl. ............................................... 341/59; 341/50
(58) Field of Search ................................. 341/58, 59, 50, 341/63, 52

(56) References Cited

U.S. PATENT DOCUMENTS

| | | | | |
|---|---|---|---|---|
| 5,451,943 | * | 9/1995 | Satomura | 341/58 |
| 5,537,422 | * | 7/1996 | Shimpuku et al. | 371/42 |
| 5,600,315 | * | 2/1997 | Shimpuku et al. | 341/59 |
| 5,742,243 | * | 4/1998 | Moriyama | 341/59 |
| 5,781,131 | * | 7/1998 | Shimpuku et al. | 341/58 |

* cited by examiner

*Primary Examiner*—Peguy Jean Pierre
(74) *Attorney, Agent, or Firm*—Frommer Lawrence & Haug, LLP.; William S. Frommer; Dennis M. Smid

(57) ABSTRACT

A demodulator refers to an internal conversion table and demodulates data that was input. Said conversion table has elements to restrict the continuation of the minimum run and a non-determined code and also has a conversion rule to take the surplus of the number of "1"s inside the elements of the data string and the number of "1"s inside the elements of the converted code word string when divided by two and then match the surplus with either a "0" or a "1". The demodulated data is input to the DSV eliminator and output by way of the buffer after removal of the DSV bit and thus a codedword string on which DVS control was performed can be efficiently and reliably decoded.

26 Claims, 4 Drawing Sheets

DEMODULATING DEVICE, DEMODULATING METHOD AND SUPPLY MEDIUM

BACKGROUND OF THE INVENTION

1. Field of the Invention

The present invention relates to a demodulating device, a demodulating method and supply medium and relates in particular to a demodulating device, a demodulating method and supply medium in which data modulated simultaneous with the performing of digital sum value control for recording onto a data transmission path or recording medium is detected as recorded data, demodulated and then reproduced.

2. Description of Related Art

Data modulation for recording or transmission of data is performed when transmitting data along a specific transmission path or recording data on a recording medium such as a magnetic disk, optical disk or magneto-optical disk, etc. One method for performing this kind of modulation is known as block coding. In block coding, a data string is converted into blocks (hereafter "data words") consisting of units of m×i bits. This dataword is converted to codewords comprised of n×i bits according to an applicable code rule. This code becomes a fixed length code when i=1, and when a plurality of i are selected, or in other words when i is selected within a specified range from i through imax (maximum value of i) and converted, this code becomes a variable length code. This block encoded code is expresses as a variable length code (d, k; m, n; r).

Here, i is called a restriction length and imax becomes r (maximum restriction length) The minimum run d shows the minimum number of consecutive "0"s within consecutive "1"s in a code string. The maximum run k shows the maximum number of consecutive "0"s within consecutive "1"s in a code string.

However in the above mentioned variable length code, NRZI (Non Return To Zero Inverted) modulation is performed in which the "1" for a variable length code is inverted while a "0" is not inverted when for instance recording on optical disks and magneto-optical disks such as compact discs and minidiscs. In this process, recording is performed based on this NRZI modulated variable length code (hereafter recorded wavelengthstring). Another system records the modulated bit string as is without using NRZI modulation for instance on magneto-optical disks to ISO standards.

Various modulation methods have been proposed. For instance, in order to perform high density recording in a direction of linear velocity when Tmin is set at the minimum inversion interval and Tmax is set as the maximum inversion interval of a recorded waveform string, the minimum inversion interval Tmin is preferably long, in other words the minimum run d should be large. In order to reproduce the clock pulse, the maximum inversion time T is preferably short, in other words, the maximum run k is preferably small.

More specifically, modulation methods are known for use with optical disks, magnetic disks, or magneto-optical disks. Such methods are referred to as variable length RLL(1–7), fixed lengy RLL (1–7) and variable length RLL (2–7), etc.

The conversion table for the fixed length RLL (1–7) code is as follows.

TABLE 1

RLL (1, 7; 2, 3; 2)

| | Data | Code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

The symbol x shown in the conversion table is set as 1 when the subsequent channel bit is 0. The symbol x is set as 0 when the subsequent channel bit is 1. The restriction length r is 2.

The parameters for the variable length RLL (1–7) are (1, 7; 2, 3; 2). The minimum inversion interval Tmin is 2(=1+1)T when the bit interval for the recorded waveform string is set as T. Also, when the bit interval of the data string is set as Tdata, the minimum inversion interval Tmin becomes 1.33 (=(2/3)×2) Tdata, the maximum inversion interval Tmax becomes 8T (5.33Tdata). Further, the detection window width Tw is shown (m/n) x Tdata and the value of Tw as 0.67 (=2/3).

In the channel bit string on which modulation was performed with RLL (1–7), the occurrence frequency for Tmin is greatest as 2T and then 2T and 3T in order of frequency of occurrence. Clock reproduction is generally more effective if many periods occur in which edge information occurs early such as with 2T and 3T. However waveform distortion is more prone to occur if 2T repeatedly occurs. In other words, the output waveform for 2T is small and easily susceptible to the effects of defocusing and tangential tilt. Further, recordings with a minimum mark that repeats are easily susceptible to external disturbances such as noise when recording at a high linear density and mistakes are prone to occur in reproducing data.

Whereupon, the inventors proposed a method in Patent Application No. Hei 9-256745 for coding to restrict continuous Tmin. This method is referred to as RML coding (or Repeated Minimum Run-Length Limited Code).

In this proposed method, when the variable length code (d, k, m, n; r) is for instance a variable length code (1, 7; 2, 3; 3), or in other words when d which is the minimum run of 0 is 1 bit, k which is the maximum run of 0 is 7 bits, m which is the maximum data length is 2 bits, n which is the basic code length is 3 bits, and r which is the maximum restriction length is 3, then the resulting conversion table is as shown below.

TABLE 2

RML (1, 7; 2, 3; 3)

| | Data | Code |
|---|---|---|
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |
| i = 3 | 100110 | 100 000 010 | restriction length here is 3.

When the data string has become "10", in Table 2 and in particular when the next four bits of data are referred to so that the htotal 6 bit data string is "100110", a special code can be provided to match this data string and limit the repetition of the minimum run to a maximum of five times by the modulation in Table 2.

The above method allows stable recording and reproduction of data at high linear density.

However coding modulation that matches the medium (transmission) is performed during recording onto a recording medium or transmission of data, but when a direct current component is contained in this modulation coding, fluctuations are prone to occur in all types of error signals such as in tracking errors for servo control of disk devices. Accordingly this direct current component should be omitted as much as possible.

DSV (digital sum value) control was not performed in the modulation coding shown here for the variable length RLL (1–7) table and the RML (1–7) table. In these kind of cases, a specified DSV control bit is inserted into a coding string (channel bit string) for a specified interval of a coded string after modulation and DSV control can then be performed.

The term DSV (digital sum value) indicates the performing of NRZI on the channel bit string (in other words level coding) and the sum then obtained from adding a +1 to the "1" of that bit string and a −1 to the "0". The DSV is a guide for the direct current component of the coding string. The direct current component of the code string is restricted by making the absolute value of the DSV smaller.

The DSV control bit to be input here is:

$$2\times(d+1)$$

In other words, when d=1, then 2×(1+1) can be made equal to 4 bits. The minimum run and maximum run can be maintained in the desired interval and inverted or non-inverted DSV control can be fully performed.

The DSV control bit is essentially a redundant bit so that from the point of view of code conversion efficiency, the DSV control bit should be as small as possible.

Here, if for instance the control bit is 1×(d+1) or in other words, when d=1, then 1×(1+1) can be made equal to 2 bits. In this case, inverted or non-inverted DSV control can be fully performed in the desired interval. The minimum run will be maintained unchanged however the maximum run will become long and become (k+2). The minimum run must be maintained unchanged for coding purposes but the maximum run need not always be protected. In some cases a pattern disrupting the maximum run is present in a format used in the synchronizing signal. In EFM plus used in DVD for instance, the maximum run is 11T but 14T is actually allowed due to the circumstances of the format.

Thus, as related above, when recording data on a recording medium such as magnetic disks, magneto-optical disks or optical disks recorded at high density and utilizing RLL (1–7) and RML (1–7) which are conversion tables not incorporating DSV control, and DSV bits were then inserted as a channel bit string with DSV control. Up until now there was the problem that when d=1, insertion of DSV bits of less than 4 bits caused the maximum run to increase.

Further, in the same way, the inserted DSV bit was a redundant bit for a recording code making it necessary for control to be performed with as few bits as possible.

SUMMARY OF THE INVENTION

In view of the above problems, DSV control is not added after issue of the code word to codes of the conventional art such as RLL (1–7) or RML (1–7), instead DSV control bits are applied inside the bit string during modulation and DSV control performed and the resulting modulated record code string when generated can then be demodulated.

The demodulating device as claimed in claim 1 is characterized in having a demodulation item consisting of a conversion table in which the minimum run d is "1", having a variable length structure comprised of elements which are each uniform predetermined elements and further having a conversion rule to take the surplus of the number of "1"s inside the elements of the data string and the number of "1"s inside the elements of the converted code word string when divided by two, and then match the surplus with either a 0 or a 1.

The demodulating method as claimed in claim 5, is characterized in that in said conversion table, the minimum run d is "1", said conversion table has a variable length structure, and elements of said structure are configured so as to be respectively uniform, and further having a conversion rule to take the surplus of the number of "1"s inside the elements of the data string and the number of "1"s inside the elements of the converted code word string when divided by two, and then match the surplus with either a "0" or a "11".

The supply medium as claimed in claim 6 provides a computer program characterized in that in said conversion table the minimum run d is "1", said conversion table has a variable length structure, and elements of said structure are configured so as to be respectively uniform, and further having a conversion rule to take the surplus of the number of "1"s inside the elements of the data string and the number of "1"s inside the elements of the converted code word string when divided by two, and then match the surplus with either a "0" or a "1".

The demodulating device as claimed in claim 7 is characterized in comprising a conversion table having a minimum run d of "1", and said conversion table has a variable length structure, and the elements restrict the repetition of the minimum run, and further has a conversion rule to take the surplus of the number of "1"s inside the elements of the data string and the number of "1"s inside the elements of the converted code word string when divided by two, and then match the surplus with either a "0" or a "1".

A demodulating method as claimed in claim 12 is characterized in comprising a conversion table having a minimum run d of "1", and said conversion table has a variable length structure, and the elements restrict the repetition of the minimum run, and further has a conversion rule to take the surplus of the number of "1"s inside the elements of the data string and the number of "1"s inside the elements of the converted code word string when divided by two, and then match the surplus with either a "0" or a "1".

The supply medium as claimed in claim 13 is characterized in comprising a conversion table having a minimum run d of "1", and said conversion table has a variable length structure, and the elements restrict the repetition of the minimum run, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 14 is characterized in comprising a conversion table having a minimum run d of "1", said conversion table has a variable length structure, and the elements have a non-determined code, and further has a conversion rule to take the surplus of the number of "1"s inside the elements of the data string and the number of "1"s inside the elements of the converted code word string when divided by two, and then match the surplus with either a "0"or a "1".

A demodulating method as claimed in claim 18 is characterized in comprising a conversion table having a minimum run d of "1", said conversion table has a variable length structure, and the elements have a non-determined code, and further has a conversion rule to take the surplus of the number of "1"s inside the elements of the data string and the number of "1"s inside the elements of the converted code word string when divided by two, and then match the surplus with either a "0" or a "1".

A supply medium as claimed in claim 19 is characterized in comprising a conversion table having a minimum run d of "1", a variable length structure, the elements have a non-determined code, and further having a conversion rule to take the surplus of the number of "1"s inside the elements of the data string and the number of "1"s inside the elements of the converted code word string when divided by two, and then match the surplus with either a "0" or a "1".

A demodulating device as claimed in claim 20 is characterized in comprising a conversion table having a minimum run d of "1", said conversion table has a variable length structure, and the elements limit the repetition of the minimum run and have a non-determined code, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 25 is characterized in comprising a conversion table having a minimum run d of "1", a variable length structure, and these elements limit the repetition of the minimum run and have a non-determined code, and further has a conversion rule to take the surplus of the number of "1"s inside the elements of the data string and the number of "1"s inside the elements of the converted code word string when divided by two, and then match the surplus with either a "0" or a "1".

A supply medium as claimed in claim 26 for supplying a computer program is characterized in comprising a conversion table having a minimum run d of "1", a variable length structure, and these elements limit the repetition of the minimum run and have a non-determined code, and further having a conversion rule to take the surplus of the number of "1"s inside the elements of the data string and the number of "1"s inside the elements of the converted code word string when divided by two, and then match the surplus with either a "0" or a "1".

A demodulating device as claimed in claim 1, a demodulating method as claimed in claim 5 and a supply medium as claimed in claim 6 characterized in that the conversion table has elements configured so as to be respectively uniform, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 7, a demodulating method as claimed in claim 12 and a supply medium as claimed in claim 13 characterized in that the conversion table is configured to have elements that limit the repetition of the minimum run and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 14, a demodulating method as claimed in claim 18 and a supply medium as claimed in claim 19 characterized in that the conversion table is configured to have a non-determined code, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 20, a demodulating method as claimed in claim 25 and a supply medium as claimed in claim 26 characterized in that the conversion table is configured to have elements limiting the repetition of the minimum run and said elements have a non-determined code, and further has a conversion rule to take the surplus of the number of "1"s inside the elements of the data string and the number of "1"s inside the elements of the converted code word string when divided by two, and then match the surplus with either a "0" or a "1".

DETAILED DESCRIPTION OF THE PREFERRED EMBODIMENTS

Figure 1:
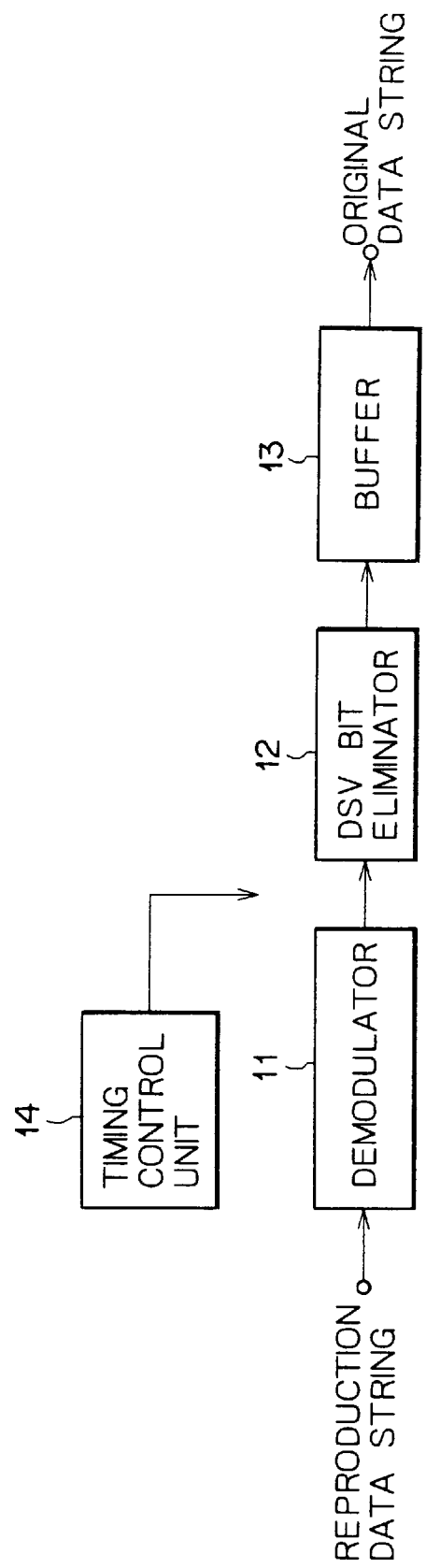
FIG. 1 is a block diagram showing the configuration of one embodiment of the demodulating device of this invention.

The embodiments of this invention are explained hereafter however in order to clarify the relation of the embodiments with the methods of this invention as listed within the scope of the claims, the embodiment (just one embodiment) corresponding to a method is added within the parentheses following each method and listed as a feature of this invention as given next. Of course this does not signify the embodiment is limited to the description related for the method.

The demodulating device as claimed in claim 1 is characterized in having a demodulation item (for instance the demodulator 11 of FIG. 1) consisting of a conversion table in which the minimum run d is "1", having a variable length structure comprising uniform predetermined respective elements and further having a conversion rule to take the surplus of the number of "1"s inside the elements of the data string and the number of "1"s inside the elements of the converted code word string when divided by two, and then match the surplus with either a 0 or a 1.

The demodulating device as claimed in claim 2 is characterized in further having a DSV control bit elimination item (for instance the DSV bit eliminator 12 of FIG. 1) for eliminating the DSV control bit input within the specified interval after the code string was demodulated by said demodulation item (for instance the demodulator 11 of FIG. 1) and output.

The demodulating device as claimed in claim 7 is characterized by a demodulation item (for instance the demodulator 11 of FIG. 1) having a conversion table with a minimum run d of "1", and said conversion table has a variable length structure, and the elements restrict the repetition of the minimum run, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 8 characterized in further having a DSV control bit elimination item (for instance the DSV bit eliminator 12 of FIG. 1) for eliminating the DSV control bit input within the specified interval after the code string was demodulated by said demodulation item (for instance the demodulator 11 of FIG. 1) and output.

A demodulating device as claimed in claim 14 is characterized by a demodulation item (for instance the demodulator 11 of FIG. 1) comprising a conversion table having a minimum run d of "1", said conversion table has a variable length structure, and the elements of the structure have a non-determined code, and further has a conversion rule to take the surplus of the number of "1"s inside the elements of the data string and the number of "1"s inside the elements of the converted code word string when divided by two, and then match the surplus with either a "0" or a "1".

A demodulating method as claimed in claim 18 with a demodulation item (for instance the demodulator 11 of FIG. 1) comprising a conversion table having a minimum run d of "1", said conversion table has a variable length structure, the elements of said structure have a non-determined code, and further has a conversion rule to take the surplus of the number of "1"s inside the elements of the data string and the number of "1"s inside the elements of the converted code word string when divided by two, and then match the surplus with either a "0" or a "1".

A supply medium as claimed in claim 19 for providing a computer program and having a demodulation item (for instance the demodulator 11 of FIG. 1) comprising a conversion table having a minimum run d of "1", a variable length structure, the elements have a non-determined code, and further having a conversion rule to take the surplus of the number of "1"s inside the elements of the data string and the number of "1"s inside the elements of the converted code word string when divided by two, and then match the surplus with either a "0" or a "1".

A demodulating device as claimed in claim 20 is characterized by a demodulation item (for instance the demodulator 11 of FIG. 1) with a conversion table having a minimum run d of "1", said conversion table has a variable length structure, and the elements limit the repetition of the minimum run and have a non-determined code, and further has a conversion rule to take the surplus of the number of "1"s inside the elements of the data string and the number of "1"s inside the elements of the converted code word string when divided by two, and then match the surplus with either a "0" or a "1".

A demodulating device as claimed in claim 21 is characterized by a demodulation item (for instance the demodulator 11 of FIG. 1) further having a DSV control bit elimination item (for instance the DSV bit eliminator 12 of FIG. 1) for eliminating the DSV control bit input within the specified interval after the code string was demodulated by said demodulation item and output.

Hereafter, the embodiments relating to this invention will be described while referring to the reference drawings however the modulation principle will first be explained. The data for the basic data length m is converted into a variable length code (d, k; m, n; r) of the basic code length n in accordance with the conversion table. This conversion table has a minimum run length d of 1 and a variable length structure. Further, the elements of this conversion table are each configured so as to be respectively uniform, the conversion table also has a code to restrict the repetitions of the minimum run, and further has a conversion rule to take the surplus of the number of "1"s inside the elements of the data string and the number of "1"s inside the elements of the converted code word string when divided by two, and then match the surplus with either a "0" or a "1".

TABLE 3

NEW-MOD RML (1,7) plus data-bit-DSV control

| Data | Code |
|---|---|
| 10 | 100 |
| 01 | 010 |
| 1110 | 000 100 |
| 1101 | 101 010 |
| 1111 | 001 010 |
| 1100 | 101 000 |
| 0010 | 000 010 |
| 0001 | 001 000 |
| 001110 | 001 001 010 |
| 001101 | 101 001 000 |
| 001111 | 101 001 010 |
| 001100 | 001 001 000 |
| 000010 | 000 101 010 |
| 000000 | 000 101 000 |
| 00000110 | 001 001 001 010 |
| 00000101 | 010 000 001 000 |
| 00000111 | 010 000 001 010 |
| 00000100 | 001 001 001 000 |
| 00001110 | 101 001 001 010 |
| 00001101 | 000 101 001 000 |
| 00001111 | 000 101 001 010 |
| 00001100 | 101 001 001 000 |
| 11011101 | 100 000 001 000 |

Table 3 has a minimum run d that equals 1, a variable length structure and a substitution code that restricts repetition of the minimum run. In other words, the number of minimum runs is restricted inside the code word string after conversion of the data and the minimum run repeats to a maximum of seven times.

Table 3 further has a conversion rule to take the surplus of the number of "1"s inside the elements of the data string and the number of "1"s inside the elements of the converted code word string when divided by two, and then match the surplus with either a "0" or a "1". For instance, the element of the data string is "1110" and corresponds to the code word string "000100", the number of "1"s are respectively three in the data string and one in the code word string. Dividing either the three or the one by 2 yields a remainder of 1 so the data string and the code word string match each other. Similarly, the elements of the data string "1111" correspond to the "001010" suchthat thenumberof "1"s of thedata string is four and the number of "1"s in the corresponding code word string is two. Dividing either the four or the two by a "2" leaves a surplus of "0" so the so the data string and the code word string match each other. The restriction length r in Table 3 equals 4. In order to provide a maximum run k equal to 7, the restriction length r must be at least 4.

TABLE 4

RML (1,7) plus data-bit-DSV control

| Data | Code | |
|---|---|---|
| 11 | *0* | (Before 0: * = 1, Before 1 : * = 0) |
| 10 | 010 | |
| 01 | 001 | |

TABLE 4-continued

RML (1,7) plus data-bit-DSV control

| Data | Code |
|---|---|
| 0011 | 010 100 |
| 0010 | 000 100 |
| 0001 | 010 000 |
| 000011 | 000 100 100 |
| 000010 | 010 100 100 |
| 00000111 | 000 100 100 100 |
| 00000110 | 000 100 000 010 |
| 00000101 | 000 100 000 001 |
| 00000100 | 000 100 000 101 |
| 00000011 | 010 100 100 100 |
| 00000010 | 010 100 000 010 |
| 00000001 | 010 100 000 001 |
| 00000000 | 010 100 000 101 |
| 10111011 | 001 000 000 010 |

Table 4 has a minimum run d that equals 1, a variable length structure, a non-determined code (*0*) within the elements of the conversion table and further has a substitution code that restricts repetition of the minimum run. In other words, the number of minimum runs is restricted inside the code word string after conversion of the data and the minimum run repeats to a maximum of seven times. Further, when the two bits of the converted data string of Table 4 are "11", a "000" or a "101" is selectedbymeans of the immediately prior conversion data string. The data "11" is converted to "000" in order to protect the minimum run, when this immediately prior conversion data string is "01" or "00000101" or "00000001" or "00000000". In all other cases, the data "11" is converted to "101".

Table 4 further has a conversion rule so that when the number of "1"s inside the elements of the data string and the number of "1"s inside the elements of the converted code word string are divided by 2, the surplus will be either a "0" or a "1" for both. For instance, the elements of the data string "0011" match the code word string "010100" and the number of "1" s in the data string is two and in the matching code word string is two so that when either is divided by 2 the surplus will be 0 so the data string and the code word string are a match.

The non-determined code in table 4 is provided in two locations for each element as a means to provide a match when the number of "1"s within the element is divided by 2. Also, in table 4, the restriction length r=4. Are striction length r of a least 4 is required in order to provide a maximum run k that is equal to 7.

In the arrangement described above, in the demodulation of the code word string by means of a table that can perform DSV control within a data string, besides demodulation of the channel bit string by the respective demodulation table, removal of the previously inserted DSV bit is also necessary.

FIG. 1 is a block diagram of the demodulating device for decoding the data converted into a modulated code in variable length code (d, k; m, n; r). In this example, demodulating of the modulated code is performed using the conversion table of table 3 so that the demodulating device incorporates the conversion table of Table 3 (Table 3 also returns the code to the data so it may also be referred to as an inverse conversion table, however it is essentially identical to a conversion table so hereafter is simply called a conversion table.)

As shown in FIG. 1, the modulating device comprises a demodulator 11 to demodulate the signal transmitted along the transmission path or the reproduced signal from the recording medium based on the demodulation table (or conversion table) and a DSV bit eliminator 12 to remove the DSV control bit inside the data string inserted in the specified interval in order to provide the original data string. The modulating device also has a buffer 13 to temporarily store the serial data that was input, load the specified transmission rate and output the data. The modulating device further comprises a timing controller 14 to generate a timing signal and regulate the timing to each section.

Figure 2:
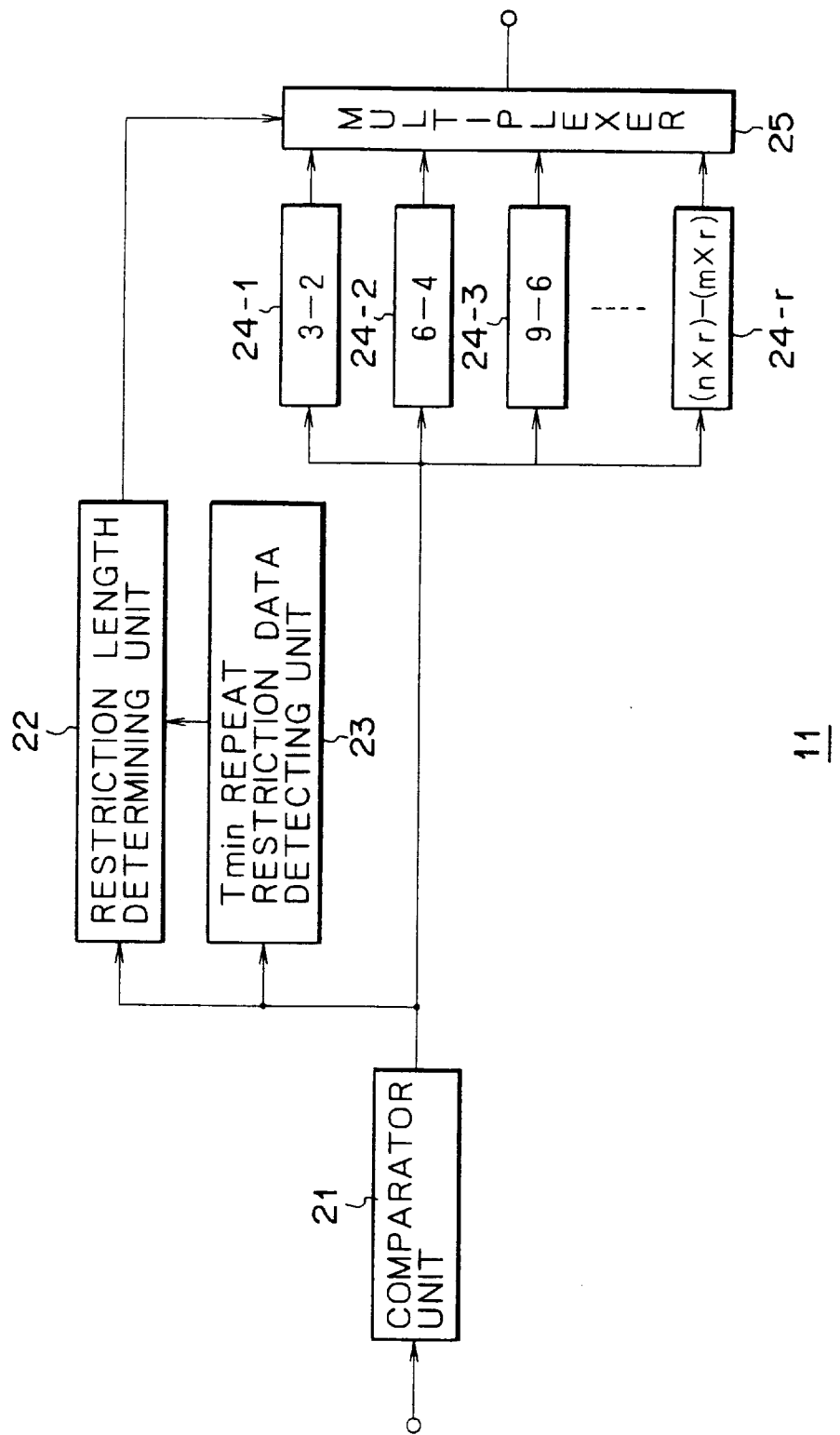
FIG. 2 is a block diagram showing the structure of the demodulator 11.

The demodulator 11 of the demodulating device of FIG. 1 is configured as shown in FIG. 2 and comprises a comparator unit 21 to binarize the signal generated by the recording medium or the signal sent along the transmission path. When the signal that was input is an NRZI modulated signal (when level coded), the comparator unit 21 also performs reverse NRZI coding of this input signal and outputs the result (edge coding). A restriction length determining unit 22 receives the digitalized signal input from the comparator unit 21 and determines the restriction length i. In the Tmin repeat restriction code data detecting unit 23, a special pattern is detected from digitalized signal input from the comparator 21 for restricting repetition of Tmin (minimum run) and the resulting information is sent to the restriction length determining unit 22.

The converters 24-1 through 24-r have tables (essentially the same conversion table as shown in table 3) for reverse conversion of variable length codes of n×i bits into data of m×i bits. A multiplexer 25 selects specified data from the converters 24-1 through 24-r and outputs this specified data as serial data.

The demodulation operation is described next. The signal sent along the transmission path or the reproduced signal from the recording medium is input to the comparator unit 21 and comparison performed. The signal output from the comparator unit 21 becomes an inverse NRZI coded (code showing an edge as "1") digital signal which is input to the restriction length determining unit 22 and determination of the restriction length then performed. This digital signal is further input to the Tmin repeat restriction code data detecting unit 23 where a special pattern is detected for restricting repetition of the minimum run and the resulting information is sent to the restriction length determining unit 22.

Figure 3:
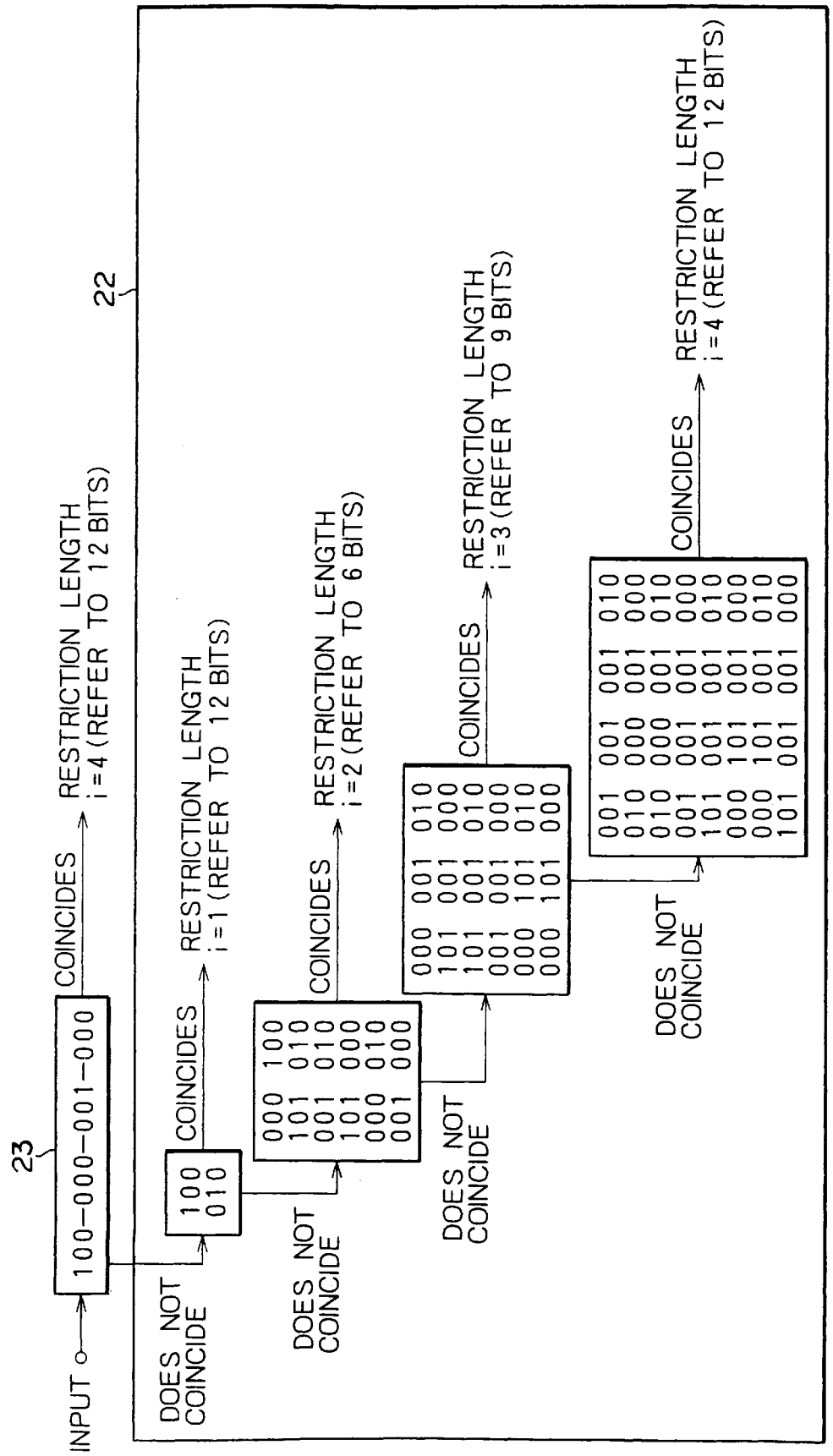
FIG. 3 is a drawing describing the operation of the Tmin repeat restriction code data detecting unit 23 and the restriction length determining unit 22 of FIG. 2.

In other words, the restriction length determining unit 22 has the conversion table (reverse conversion table) shown in table 3. Also, the Tmin repeat restriction code data detecting unit 23 has a conversion table from among the conversion tables shown in table 3, provided for restricting the repetition of Tmin (more specifically, a table for converting the code "100000001000" into the data "11011101". The table of table 3 is split into two segments to hold the restriction length determining unit 22 and the Tmin repeat restriction code data detecting unit 23 data. The restriction length of the modulation code that was input is then determined as shown in FIG. 3.

At this point, when the code that was input is "100", the restriction length determining unit 22 determines a restriction length i of 1 (i=1) for this code. Also at this time, a code consisting of a total of 12 bits is referred to in the Tmin repeat restriction code data detecting unit 23 to determine whether or not there is a match with the code "100000001000". If a match is found, that code is identified as a data pattern for restricting repetitions of Tmin and the identification results are output to the restriction length determining unit 22. When a signal is input to the restriction length determining unit 22 indicating a data pattern from the Tmin repeat restriction code data detecting unit 23 for restricting repetitions of Tmin, the signal is identified as restriction length i=4 and having priority over other restriction lengths. So when the code that was input is "100", a 12 bit code is referred to and when "100000001000", the restriction length is identified (or determined) as i=4. When the 12 bit code is different from "100000001000" the restriction length is identified as i=1.

When the code that is input is "000100", "101010" "001010", "101000" "000010" or "001000", the restriction length for that code is identified (or determined) as i=2.

When the code that is input is "001001010", "101001000" "101001010", "001001000" "000101010" or "000101000", the restriction length for that code is identified (or determined) as i=3.

Further, the code that is input is "001001001010", "010000001000" "010000001010", "001001001000", "101001001010", "000101001000" "000101001010" or "101001001000", then the restriction length is identified as i=4.

Identification (or determination) of the restriction length is explained by use of the reference bit. The respective restriction length×3 bits is referred to when i is other than 1. In other words, for i=2, 6 bits are referred to in order to find if there is a match or not. Also, the 9 bit is referred to at i=3 to determine whether or not there is a match. Further at i=4, the 12 bits are referred to determine whether or not there is a match.

The data for restricting the repetition of the minimum run is provided at a restriction length of i=4. To identify the data for restricting the repetition of the minimum run, 12 bits are referred to and when "100000001000", the Tmin repeat restriction code data detecting unit 23 sends a detection signal to the restriction length determining unit 22.

Thus, demodulation by means of this table makes use of the characteristics of the variable length table and the establishing of variable lengths such as i=2 and i=3 may serve to match the elements of the respective tables.

However, in a remaining restriction length determined to be i=1, all 12 bits are referred to so demodulation errors will not occur in the table. Further, restriction length identification (determination) is performed with i set as equal to 1 (i=1), when the 12 bits are not one of the following strings; "100000001000", "010000001000" or "010000001010". Actually the occurrence of one of these strings signifies a restriction length of i=4. Other than one of these three strings, a string whose first three bits are "100" or "010" will be identified as having a restriction length i of 1 (i =1).

In the converter 24-1, the data "10" is written into the address "100", and the data "01" is written into the address "010". Matching data is also written in the same way in each of the tables from the converter 24-2 onward, and data corresponding to the address is output.

A multiplexer 25 selects one converter 24-i according to the restriction length determination results of the restriction length determining unit 22 and then issues an output as serial data. In other words, when the restriction length i is 1, the multiplexer 25 selects the converter 24-1 and outputs two bits of demodulated data as serial data. Also, when i=2, the multiplexer 25 selects the converter 24-2 and outputs four bits of demodulated data as serial data. Further, shen i =3, the multiplexer 25 selects the converter 24-3 and outputs six bits of demodulated data as serial data. This process continues in the same way thereafter.

The Tmin repeat restriction code data detecting unit 23 and the restriction length determining unit 22 may determine the restriction length at the point where distinguished from other patterns. Tracing the reverse of table 3 reveals that the restriction length is determined and further that the demodulation data string is determined when the code string is like that of Table.

TABLE 5

Reverse conversion table (1, 7; 2, 3; 4)

| | Code string | Demodulation data string |
|---|---|---|
| i = 1 | 100 | 10 |
| | 010 | 01 |
| i = 2 | 000 | 100 1110 |
| | 101 | 010 1101 |
| | 001 | 010 1111 |
| | 101 | 000 1100 |
| | 000 | 010 0010 |
| | 001 | 000 0001 |
| i = 3 | 001 | 001 010 001110 |
| | 101 | 001 000 001101 |
| | 101 | 001 010 001111 |
| | 001 | 001 000 001100 |
| | 000 | 101 010 000010 |
| | 000 | 101 000 000000 |
| i = 4 | 001 | 001 001 010 00000110 |
| | 010 | 000 001 000 00000101 |
| | 010 | 000 001 010 00000111 |
| | 001 | 001 001 000 00000100 |
| | 101 | 001 001 010 00001110 |
| | 000 | 101 001 000 00001101 |
| | 000 | 101 001 010 00001111 |
| | 101 | 001 001 000 00001100 |
| RML | 100 | 000 001 000 11011101 (RML-code) |

The i=4 of "100000001000", in the Tmin repeat restriction code data detecting unit 23 corresponds to i 1 through 4 in the restriction length determining unit 22.

In this case, when a bit shift error occurs the error propagation length when demodulated will be a maximum of 14 data bits.

Figure 4:
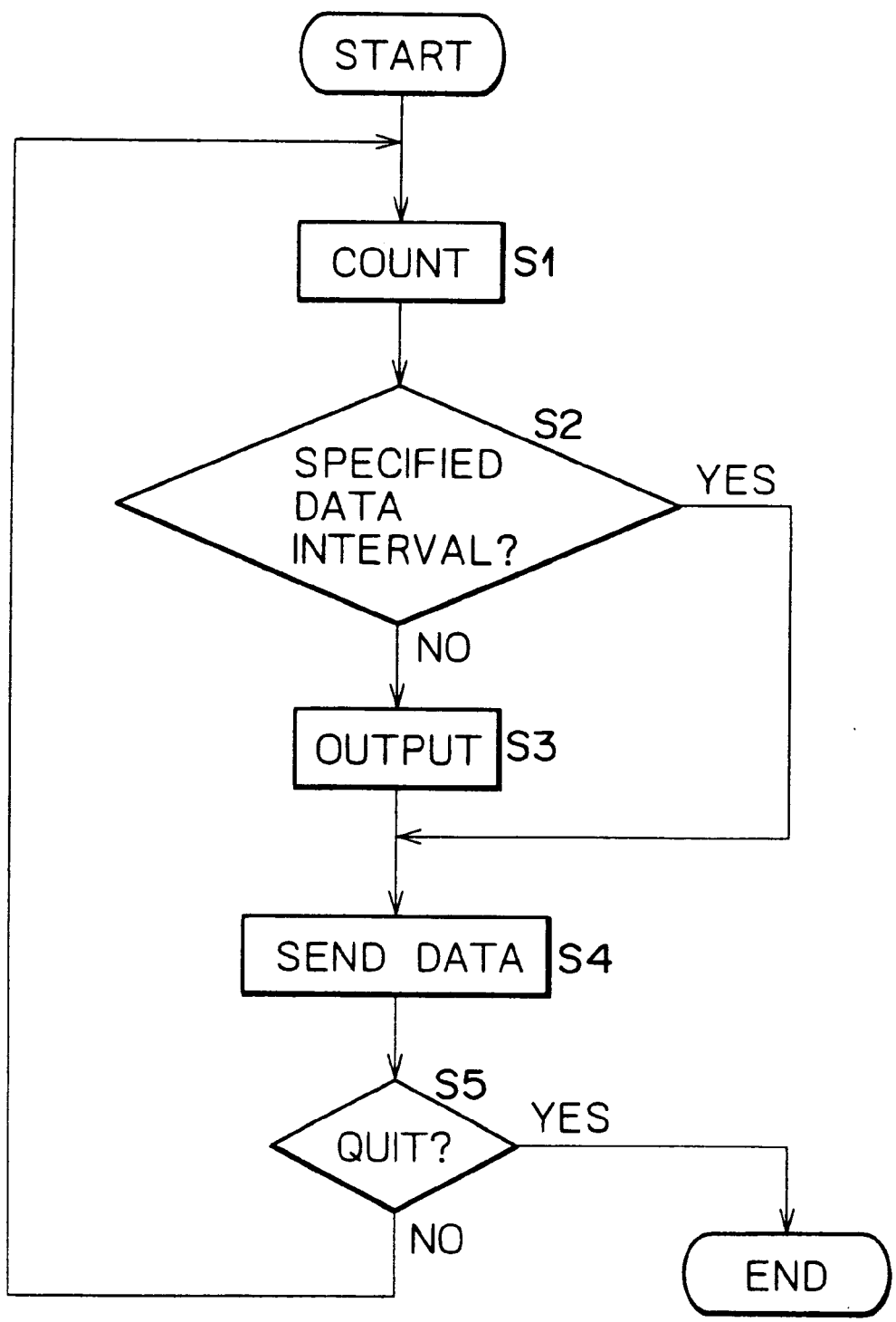
FIG. 4 is a flowchart showing the operation process of the DSV bit eliminator 12.

The output the demodulator 11 is input to the DSV bit eliminator 12 and processing to remove the DSV bit then performed. FIG. 4 is a flowchart showing the actual processing in the DSV bit eliminator 12.

The DSV bit eliminator 12 has an internal counter. The DSV bit is fit in intervals inside specified data bits in the data string obtained from the demodulator 11. At this point, in Step S1, the DSV bit eliminator 12 counts the data (code) that was input. In Step S2 a determination is made as to whether or not that count value is the bit count value in which the DSV bit was inserted. When this count value is not the count value in which the DSV bit was inserted, the process proceeds to Step S3 and the DSV bit eliminator 12 outputs the bit input from the demodulator 11 unchanged, to the buffer 13.

However, when the count value is determined to be the count value in which the DSV bit was inserted, the processing in Step S3 is skipped. In other words, this bit (or DSV bit) is eliminated without being output.

The process then proceeds to Step S4 in which the DSV bit eliminator 12 sends the data processed in Step S3 to the buffer 13. Next, in Step S5, a determination is made if input of the data from the demodulator 11 is complete or not. If not complete, the process returns to Step S1 and the processes subsequent to Step S1 are repeated and the data string is demodulated as described above.

In this invention therefore, as described above, demodulation can be performed while implementing DSV control with good efficiency. Further the following effects of the invention can be obtained by modulation/demodulation utilizing a table having a code for restricting the number of repetitions of the minimum run length.

A first effect is that DSV control is performed with 1.5 code words for d=1 and further, error propagation is unlikely to occur since the number of bits is the same as the DSV bits that were inserted. A second effect is that there is greater tolerance versus skew at high linear density compared to the conventional art. A third effect is that compared to the conventional art, small signal portions have been decreased, waveform processing accuracy for AGC and PLL has been improved and the overall characteristics have been enhanced. A fourth effect is that compared to the conventional art, a shorter path memory length can be designed when using methods such as Viterbi decoding thus allowing the circuit scale size to be reduced.

Besides recording mediums such as magnetic disks, CD-ROMs, and solid-state memories, communication mediums such as networks and satellites may be utilized as supply mediums to provide computer programs to the user for performing the above described processing.

Therefore, as was related above, the demodulating device as claimed in claim 1, the demodulating method as claimed in claim 5 and the supply medium as claimed in claim 6 utilize elements inside a conversion table which are determined to be respectively uniform, and further the surplus is taken of the number of "1"s inside the elements of the data string and the number of "1"s inside the elements of the converted code word string when divided by two, and this surplus then matched with either a "0" or a "1" so that demodulation can be performed on data strings of code word strings subjected to DSV control with good efficiency.

According to the demodulating device as claimed in claim 7, the demodulating method as claimed in claim 12 and the supply medium as claimed in claim 13, the conversion table comprises elements holding a code for restricting the repetitions of the minimum run and further the surplus is taken of the number of "1"s inside the elements of the data string and the number of "1"s inside the elements of the converted code word string when divided by two, and this surplus then matched with either a "1" or a "1" so that design of the device is simple from the point of view of generating a clock pulse.

According to the demodulating device as claimed in claim 14, the demodulating method as claimed in claim 18 and the supply medium as claimed in claim 19, the elements within the conversion table hold a non-determined code, and further the surplus is taken of the number of "1"s inside the elements of the data string and the number of "1"s inside the elements of the converted code word string when divided by two, and this surplus then matched with either a "0" or a "1" so that demodulation can be performed on data strings of code word strings subjected to DSV control with good efficiency.

According to the demodulating device as claimed in claim 20, the demodulating method as claimed in claim 25 and the supply medium as claimed in claim 26, the elements are provided within the conversion table to restrict the repetition of the minimum run along with holding a non-determined code, and further a surplus is taken of the number of "1"s inside the elements of the data string and the number of "1"s inside the elements of the converted code word string when divided by two, and this surplus then matched with either a "0" or a "1" so that demodulation can be performed speedily and accurately on data strings in code word strings subjected to DSV control with good efficiency.

In any case, a data bit identical to the bit inside the data string is inserted as the DSV bit so that regardless of inversion or non-inversion, operation with respect to error propagation is stable and data can be decoded with greater reliability.

What is claimed is:

1. A demodulating device comprising a demodulating item which converts a variable length code (d, k; m, n; r) having a basic code length of n bits into data having a basic data length of m bits based on a conversion table and then outputs the converted data wherein the minimum run d is "1", said conversion table has a variable length structure and elements therein are configured so as to be respectively uniform, and wherein the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

2. A demodulating device as claimed in claim 1 further having a DSV control bit elimination item for eliminating the DSV control bit input within the specified interval after the code string was demodulated by said demodulation item and output.

3. A demodulating device as claimed in claim 1 having a maximum run k of at least 7 in said conversion table.

4. A demodulating device as claimed in claim 3 having a restriction length r of at least 4 when the maximum run is 7.

5. A demodulating device comprising a demodulating item which converts a variable length code (d, k; m, n; r) having a basic code length of n bits into data having a basic data length of m bits based on a conversion table and then outputs the converted data wherein the minimum run d is "1", said conversion table has a variable length structure and elements therein restrict the repetition of the minimum run, and the elements of said conversion table comply with a conversion rule in which the number of "1"s in a data string and the number of "1"s in a converted code word string each have the same remainder of either a "0" or a "1" when divided by two for all of the data strings and corresponding code word strings within said conversion table.

6. A demodulating device as claimed in claim 5 further having a DSV control bit elimination item for eliminating the DSV control bit input within the specified interval after the code string was demodulated by said demodulation item and output.

7. A demodulating device as claimed in claim 5 having a maximum run k of at least 7 in said conversion table.

8. A demodulating device as claimed in claim 7 having a restriction length r of at least 4 when the maximum run is 7.

9. A demodulating device as claimed in claim 5 that elements of said conversion table to restrict the minimum run are elements that do not increase the restriction length.

10. A demodulating device comprising a demodulating item which converts a variable length code (d, k; m, n; r) having a basic code length of n bits into data having a basic data length of m bits based on a conversion table and then outputs the converted data wherein the minimum run d is "1", said conversion table has a variable length structure and elements therein have a non-determined code, and the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

11. A demodulating device as claimed in claim 10 further having a DSV control bit elimination item for eliminating the DSV control bit input within the specified interval after the code string was demodulated by said demodulation item and output.

12. A demodulating device as claimed in claim 10 having a maximum run k of at least 7 in said conversion table.

13. A demodulating device as claimed in claim 12 having a restriction length r of at least 4 when the maximum run is 7 in said onversion table.

14. A demodulating device comprising a demodulating item which converts a variable length code (d, k; m, n; r) having a basic code length of n bits into data having a basic data length of m bits based on a conversion table and then outputs the converted data wherein the minimum run d is "1", said conversion table has a variable length structure and elements therein limit the repetition of the minimum run and have a non-determined code, and the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

15. A demodulating device as claimed in claim 14 further having a DSV control bit elimination item for eliminating the DSV control bit input within the specified interval after the code string was demodulated by said demodulation item and output.

16. A demodulating device as claimed in claim 14 having a maximum run k of at least 7 in said conversion table.

17. A demodulating device as claimed in claim 14 having a restriction length r of at least 4 when the maximum run is 7 in said conversion table.

18. A demodulating device as claimed in claim 14 wherein elements for limiting the repetition of the minimum run in said conversion table, are elements that do not increase the restriction length.

19. A demodulating method for converting a variable length code (d, k; m, n; r) having a basic code length of n bits into data having a basic data length of m bits based on a conversion table and then outputs the converted data wherein the minimum run d is "1", said conversion table has a variable length structure and elements therein are configured so as to be respectively uniform, and wherein the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

20. A supply medium providing a computer program utilized in the demodulating device for converting a variable length code (d, k; m, n; r) having a basic code length of n bits into data having a basic data length of m bits based on a conversion table and then outputs the converted data wherein the minimum run d is "1", said conversion table has a variable length structure and elements therein are configured so as to be respectively uniform, and wherein the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

21. A demodulating method for demodulating to convert a variable length code (d, k; m, n; r) having a basic code length of n bits into data having a basic data length of m bits based on a conversion table and then output the converted data wherein the minimum run d is "1", said conversion table has a variable length structure and elements therein restrict the repetition of the minimum run, and the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

22. A supply medium providing a computer program utilized in the demodulating device for converting a variable length code (d, k; m, n; r) having a basic code length of n bits into data having a basic data length of m bits based on a conversion table and then output the converted data wherein said conversion table has a minimum run d of "1", said conversion table has a variable length structure and elements therein restrict the repetition of the minimum run, and the elements of said conversion table comply with a conversion rule in which the number of"1"s in a data string and the number of"1"s in a corresponding converted code word string each have the same remainder of either a "0" or a "1" when divided by two for all of the data strings and corresponding code word strings within said conversion table.

23. A demodulating method for demodulating to convert a variable length code (d, k; m, n; r) having a basic code length of n bits into data having a basic data length of m bits based on a conversion table and then output the converted data wherein the minimum run d is "1", said conversion table has a variable length structure and elements therein have a non-determined code, and the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

24. A supply medium providing a computer program utilized in the demodulating device for converting a variable length code (d, k; m, n; r) having a basic code length of n bits into data having a basic data length of m bits based on a conversion table and then output the converted data wherein said conversion table has a minimum run d of "1", a variable length structure, and elements therein have a non-determined code, and wherein the elements of said conversion table comply with a conversion rule in which the number of"1"s in a data string and the number of "1"s in a corresponding converted code word string each have the same remainder of either a "0" or a "1" when divided by two for all of the data strings and corresponding code word strings within said conversion table.

25. A demodulating method for demodulating to convert a variable length code (d, k; m, n; r) having a basic code length of n bits into data having a basic data length of m bits based on a conversion table and then output the converted data wherein said conversion table of said demodulation item has a minimum run d of "1", a variable length structure, and elements therein limit the repetition of the minimum run and have a non-determined code, and wherein the elements of said conversion table comply with a conversion rule in which the number of "1"s in a data string and the number of "1"s in a corresponding converted code word string each have the same remainder of either a "0" or a "1" when divided by two for all of the data strings and corresponding code word strings within said conversion table.

26. A supply medium providing a computer program utilized in the demodulating device for converting a variable length code (d, k; m, n; r) having a basic code length of n bits into data having a basic data length of m bits based on a conversion table and then output the converted data wherein said conversion table has a minimum run d of "1", a variable length structure, and elements therein limit the repetition of the minimum run and have a non-determined code, and wherein the elements of said conversion table comply with a conversion rule in which the number of "1"s m a data string and the number of "1"s in a corresponding converted code word string each have the same remainder of either a "0" or a "1" when divided by two for all of the data strings and corresponding code word strings within said conversion table.

* * * * *